(12) United States Patent
Jajoo et al.

(10) Patent No.: US 9,762,181 B2
(45) Date of Patent: Sep. 12, 2017

(54) METHOD AND SYSTEM FOR A MULTI-CORE MULTI-MODE VOLTAGE-CONTROLLED-OSCILLATOR (VCO)

(71) Applicant: Maxlinear, Inc., Carlsbad, CA (US)

(72) Inventors: Abhishek Jajoo, Carlsbad, CA (US); Pawan Tiwari, Carslbad, CA (US); Vamsi Paidi, Carlsbad, CA (US)

(73) Assignee: Maxlinear, Inc., Carlsbad, CA (US)

(*) Notice: Subject to any disclaimer, the term of this patent is extended or adjusted under 35 U.S.C. 154(b) by 0 days.

(21) Appl. No.: 15/224,530

(22) Filed: Jul. 30, 2016

(65) Prior Publication Data

US 2017/0033738 A1 Feb. 2, 2017

Related U.S. Application Data

(60) Provisional application No. 62/199,827, filed on Jul. 31, 2015.

(51) Int. Cl.
*H03K 3/03* (2006.01)
*H03B 5/20* (2006.01)
*H03L 7/23* (2006.01)
*H03B 27/00* (2006.01)

(52) U.S. Cl.
CPC ............... *H03B 5/20* (2013.01); *H03B 27/00* (2013.01); *H03L 7/23* (2013.01); *H03B 2200/009* (2013.01)

(58) Field of Classification Search
CPC .... H03B 27/00; H03B 5/00; H03B 2200/009; H03L 7/23

USPC ............... 331/96, 107 DP, 107 SL, 2, 46, 57
See application file for complete search history.

(56) References Cited

U.S. PATENT DOCUMENTS 8,410,858 B2 * 4/2013 Wood ..................... G06F 1/10
331/45

* cited by examiner

*Primary Examiner* — Arnold Kinkead
(74) *Attorney, Agent, or Firm* — McAndrews, Held & Malloy

(57) ABSTRACT

Methods and systems for a multi-core multi-mode voltage-controlled-oscillator (VCO) may comprise generating a plurality of oscillating signals utilizing a plurality of voltage controlled oscillators (VCOs) arranged symmetrically on an integrated circuit, where interconnects for the VCOs may be arranged in quiet zones at locations equidistant from each pair of the plurality of VCOs. An interconnection ring may be centered within the arranged VCOs that comprises at least two conductive lines that couple to output terminals of each of said plurality of VCOs. The plurality of VCOs may receive control signals from interconnects coupled to at least one conductive line in the interconnection ring. The plurality of VCOs may receive control signals from a conductive line in said interconnection ring. A positive terminal of a first VCO of a pair of adjacent VCOs of the plurality of VCOs may be coupled to a same conductive line of the interconnection ring as a negative terminal of a second of the pair of adjacent VCOs. The interconnection ring ay be circular. Impedances may couple the VCOs to the interconnection ring. Bias signals may be communicated to each of the plurality of VCOs from the interconnection ring. The plurality of VCOs may include four VCOs arranged equidistant from a center point.

27 Claims, 3 Drawing Sheets

METHOD AND SYSTEM FOR A MULTI-CORE MULTI-MODE VOLTAGE-CONTROLLED-OSCILLATOR (VCO)

CLAIM OF PRIORITY

This patent application makes reference to, claims priority to and claims benefit from the U.S. Provisional Patent Application Ser. No. 62/199,827, filed on Jul. 31, 2015, and entitled "METHOD AND SYSTEM FOR A MULTI-CORE MULTI-MODE VOLTAGE-CONTROLLED-OSCILLATOR (VCO)."

The above stated application is hereby incorporated herein by reference in its entirety.

TECHNICAL FIELD

Aspects of the present application relate to communications. More specifically, certain embodiments of the disclosure relate to a method and a system for a multi-core multi-mode voltage-controlled-oscillator (VCO).

BACKGROUND

Existing methods and systems for voltage-controlled-oscillator (VCO) can introduce disturbances and/or handle such disturbances in an inefficient manner. In this regard, communication via wireless and/or wired connections may comprise reception and/or transmission of radio frequency (RF) signals. For example, communication devices may transmit and/or receive RF signals carrying exchanged data, with the RF signals being configured in accordance with corresponding wired and/or wireless protocols or standards. Accordingly, signal processing (e.g., of RF signals) must be performed during wireless and/or wired communications to enable proper exchange of information. Example signal processing operations may comprise filtering, amplification, up-conversion/down-conversion of baseband signals, modulation/demodulation, analog-to-digital conversions and digital-to-analog conversions, encoding/decoding, and/or encryption/decryption.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for a multi-core multi-mode voltage-controlled-oscillator (VCO), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Certain implementations of the disclosure may be found in a method and system for a multi-core, multi-mode voltage-controlled-oscillator (VCO). Exemplary aspects of the disclosure may comprise generating a plurality of oscillating signals utilizing a plurality of voltage controlled oscillators (VCOs) arranged symmetrically on an integrated circuit, where interconnects for the VCOs may be arranged in quiet zones at locations equidistant from each pair of the plurality of VCOs. An interconnection ring may be centered within the arranged VCOs that comprises at least two conductive lines that couple to output terminals of each of said plurality of VCOs. The plurality of VCOs may receive control signals from interconnects coupled to at least one conductive line in the interconnection ring. The plurality of VCOs may receive control signals from a conductive line in said interconnection ring. A positive terminal of a first VCO of a pair of adjacent VCOs of the plurality of VCOs may be coupled to a same conductive line of the interconnection ring as a negative terminal of a second of the pair of adjacent VCOs. The interconnection ring may be circular. Impedances may couple the VCOs to the interconnection ring. Bias signals may be communicated to each of the plurality of VCOs from the interconnection ring. The plurality of VCOs may include four VCOs arranged equidistant from a center point.

Figure 1:
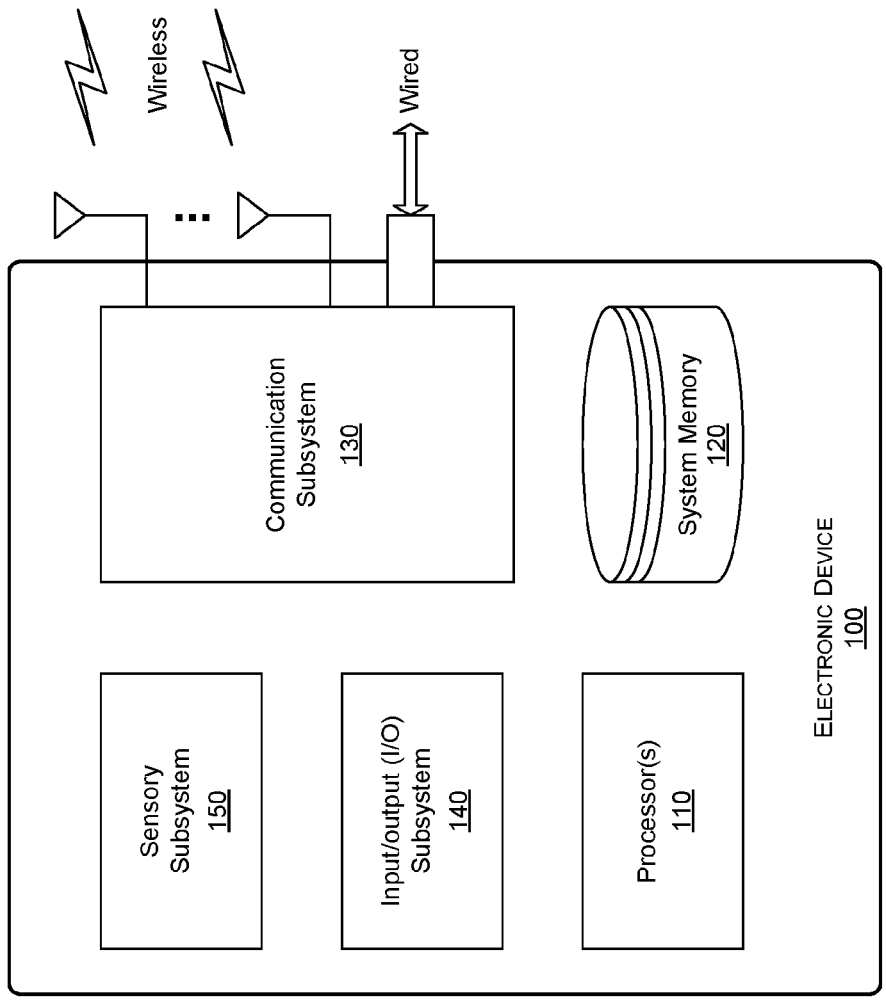
FIG. 1 illustrates an example electronic device that may utilize a voltage-controlled-oscillator (VCO) in accordance with various implementations of the disclosure.

FIG. 1 illustrates an example electronic device that may utilize a voltage-controlled-oscillator (VCO) in accordance with various implementations of the disclosure. Referring to FIG. 1, there is shown an electronic device 100.

The electronic device 100 may comprise suitable circuitry, interfaces, logic, and/or code for implementing various aspects of the disclosures. In this regard, the electronic device 100 the electronic device may be configured to support performing, executing or running various operations, functions, applications and/or services. For example, the electronic device 100 may be operable to support, in some instances, such operations as communication operations, processing or handling of data, input/output operations, or the like. In this regard, the electronic device 100 may enable and/or support communication of data, such as via wired and/or wireless connections, which may be configured in accordance with one or more supported wireless and/or wired protocols or standards. To support input/output operations, the electronic device 100 may comprise components or subsystems for enabling interactions with a user (e.g., end-user or installer), so as to obtain user input and/or to provide user output. In some instances, the electronic device 100 may be a handheld mobile device—i.e., be intended for use on the move and/or at different locations. In this regard, the electronic device 100 may be designed and/or configured to allow for ease of movement, such as to allow it to be readily moved while being held by the user as the user moves, and the electronic device 100 may be configured to perform at least some of the operations, functions, applications and/or services supported by the device on the move. Examples of electronic devices may comprise set-top boxes, televisions, displays, gateways, modems, access points, femtocells, computers, cellular phones, smartphones, tablets, and or any other network node. The disclosure, however, is not limited to any particular type of electronic device.

The electronic device 100 may comprise, for example, one or more processors 110, a system memory 120, a communication subsystem 130, an input/output (I/O) subsystem 140, and a sensory subsystem 150.

The processor 110 may comprise suitable circuitry, interfaces, logic, and/or code that may be operable to perform general and/or specialized processing operations in the electronic device 110. For example, the processor 110 may comprise a general purpose processor (e.g., a central processing unit or CPU), a special purpose processor (e.g., graphics processing unit or GPU, or a visual processing unit or VPU), or the like. The disclosure, however, is not limited to any particular type of processor. When utilized as a general purpose processor, the processor 110 may be operable to, for example, process or handle data, control or manage operations of the electronic device 100, and/or handle or support tasks and/or applications performed therein. In this regard, the processor 110 may be utilized to configure and/or control operations of various components and/or subsystems of the electronic device 100, by utilizing, for example, one or more control signals. In some instances, however, the processor 110 may comprise a specialized processor, such as a video/graphics processor or a dedicated application processor that may be utilized for running and/or executing applications (or programs) in the electronic device 100.

The system memory 120 may comprise suitable circuitry, interfaces, logic, and/or code that may enable permanent and/or non-permanent storage, buffering, and/or fetching of data, code and/or other information, which may be used, consumed and/or processed. In this regard, the system memory 120 may comprise different memory technologies, including, for example, read-only memory (ROM), random access memory (RAM), Flash memory, solid-state drive (SSD), and/or field-programmable gate array (FPGA). The disclosure, however, is not limited to any particular type of memory or storage device. The system memory 120 may store, for example, configuration data, which may comprise parameters and/or code, comprising software and/or firmware. The disclosure is not limited, however, to any particular type of configuration data.

The communication subsystem 130 may comprise suitable circuitry, interfaces, logic, and/or code operable to communicate data from and/or to the electronic device, such as via one or more wired and/or wireless connections. The communication subsystem 130 may be configured to support one or more wired protocols and/or interfaces, and/or one or more wireless protocols and/or interfaces, facilitating transmission and/or reception of signals to and/or from the electronic device 100 and/or processing of transmitted or received signals in accordance with applicable wired or wireless protocols. Examples of wireless protocols or standards that may be supported and/or used by the communication subsystem 130 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 1G/2G+(e.g., GSM/GPRS/EDGE, and IS-95 or cdmaOne) and/or 1G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 130 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the communication subsystem 130 comprise, for example, filtering, amplification, analog-to-digital conversion and/or digital-to-analog conversion, up-conversion/down-conversion of baseband signals, encoding/decoding, encryption/decryption, and/or modulation/demodulation.

The I/O subsystem 140 may comprise suitable circuitry, interfaces, logic, and/or code for enabling and/or managing user (e.g., end-user or installer) interactions with the electronic device 100, such as obtaining input from, and/or to providing output to, the device user(s). The I/O subsystem 140 may support various types of inputs and/or outputs, including, for example, video, audio, and/or text. In this regard, dedicated I/O devices and/or components, external to (and coupled with) or integrated within the electronic device 100, may be utilized for inputting and/or outputting data during operations of the I/O subsystem 140. Examples of such dedicated I/O devices may comprise displays, audio I/O components (e.g., speakers and/or microphones), mice, keyboards, touch screens (or touchpads), and the like. In some instances, user input obtained via the I/O subsystem 140, may be used to configure and/or modify various functions of particular components or subsystems of the electronic device 100.

The sensory subsystem 150 may comprise suitable circuitry, interfaces, logic, and/or code for obtaining and/or generating sensory information, which may relate to the electronic device 100, its user(s), and/or its environment. For example, the sensory subsystem 150 may comprise ambient conditions (e.g., temperature, humidity, or light) sensors, positional or location sensors (e.g., GPS or other GNSS based sensors), and/or motion related sensors (e.g., accelerometer, gyroscope, pedometers, and/or altimeters).

In operation, the electronic device 100 may be utilized (e.g., by a user) to perform, execute and/or run various operations, functions, applications or services, such as using pre-configured instructions and/or based on real-time user instructions or interactions. In this regard, various types of operations, functions, applications or services may be available in or supported by the electronic device 100. For example, the electronic device 100 may be used for executing programs, playing video and/or audio content, gaming, email applications (and/or similar type of web based communications), calling services (e.g., voice calls), networking services (e.g., WiFi hotspot, Bluetooth piconet, and/or active 3G/femtocell data channels), or the like. The disclosure, however, is not limited to any particular type of operations, functions, applications or services.

In some instances, operations performed by the electronic device 100 may sometimes require generation of signals with particular characteristics, such as frequencies. For example, the electronic device 100 may be utilized in communication of data, such as using available wireless or wired connections. In this regard, data may be communicated using radio frequency (RF) signals, which may be communicated to and/or from the electronic device 100 over supported wired or wireless interfaces. Processing signals in the electronic device 100 may be performed using suitable components or circuits (e.g., in the communication subsystem 130), in which signals may be generated for use as baseband signals or carrier signals for example. The electronic device 100 may also be utilized in generating audio signals (e.g., for output via speakers), such as based on digital audio content obtained from local sources (storage media), remote sources (e.g., broadcast nodes), or user input (e.g., clicks corresponding to interactions with touchscreen). Various methods may be used in generating signals required by the electronic device 100. For example, one of the more common methods for generating signals (e.g., for use in signal processing) may be using oscillator circuits. In this regard, oscillator circuits may be operable to produce a repetitive, oscillating electronic signal (e.g., a sine wave) based on some form of input (e.g., voltage). Signal generation in the electronic device 100 may, in some instances, entail or comprise frequency synthesis. In this regard, frequency synthesis may comprise generating various ranges of frequencies from a single fixed source (e.g., oscillator). Frequency synthesis may be used in such systems or applications as, for example, communications (e.g., radio receivers, mobile telephones, radiotelephones, walkie-talkies, satellite receivers, navigational systems, etc.), audio processing or the like. Frequency synthesis may comprise such operations as frequency multiplication, frequency division, and frequency mixing (the frequency mixing process generates sum and difference frequencies) operations to produce the desired output signal.

In example implementation, the electronic device 100 may incorporate a plurality of phase-locked loop (PLL) circuits, for use in signal generation related operations. In this regard, a PLL may be operable to generate output signal(s) whose phase may be related to the phase of an input (reference) signal. PLL circuits may typically comprise some sort of variable frequency oscillator (e.g., voltage controlled oscillator or VCO) and a phase detector, with the phase detector being utilized to compare the phase of the reference signal with the phase of the signal derived from the output of the oscillator (e.g., to enable determining necessary adjustments to the frequency of its oscillator to keep the phases matched). The signal from the phase detector may then be used to control the oscillator in a feedback loop manner. Because frequency relate to phase (e.g., frequency is the time derivative of phase), keeping the input and output phase locked may allow keeping the input and output frequencies in lock as well. Consequently, PLLs may be utilized to track input frequencies, and/or to generate output frequencies related thereto (a frequency that is a multiple of an input frequency). Such frequency control may be utilized in various processing operations, such as demodulation, frequency synthesis, and the like. PLLs are widely employed in radio, communications, computers and other electronic applications. In this regard, PLLs may be utilized to enable recovering signals from a noisy communication channel, generate stable frequencies at a multiple of an input frequency (frequency synthesis), or distribute clock timing pulses various circuits or systems (e.g., microprocessors, such as the processors 110).

Signal generation (e.g., using PLL circuits) may be subject, in some instances, to disturbances, such as due to particular conditions that may be affect the signal generation. In this regard, conditions that may affect signal generation may comprise environmental conditions (e.g., temperature), physical conditions (e.g., movement, rotation or shaking of system incorporating the signal generator), functional conditions—i.e., conditions relating directly to the signal generation (e.g., supply variations), and/or the like. The disclosure, however, is not limited to any particular type of conditions. Accordingly, in various implementations of the disclosure, an enhanced architecture may be utilized in implementing components (e.g., PLLs) used in generation of signals in electronic devices, such as the electronic device 100. In this regard, such enhanced architecture may enable expedited modification when changing output signals, and/or providing adaptive and dynamic tuning, to ensure that an output signal may be maintained when there may be change in conditions affecting signal generation (e.g., change in temperature, which may be detected using the sensory subsystem 150 for example, voltage/supply variations, etc.). In addition, VCO architecture may be configured to mitigate the effect of noise generated from large voltage swings on the multiple VCO's that may be utilized in a multi-standard and/or multi-frequency system.

Accordingly, in various implementations of the disclosure, an enhanced architecture may be utilized in implementing VCOs in a multi-core structure. The interconnection of the multiple cores may result in regions without induced voltages from the large swings encountered in the VCOs, i.e. "quiet zones." Control lines, input, and output lines may be configured in these quiet zones for low noise transmission of signals. An example of such enhanced architecture is described in more detail in connection with FIGS. 2 and 3.

Figure 2:
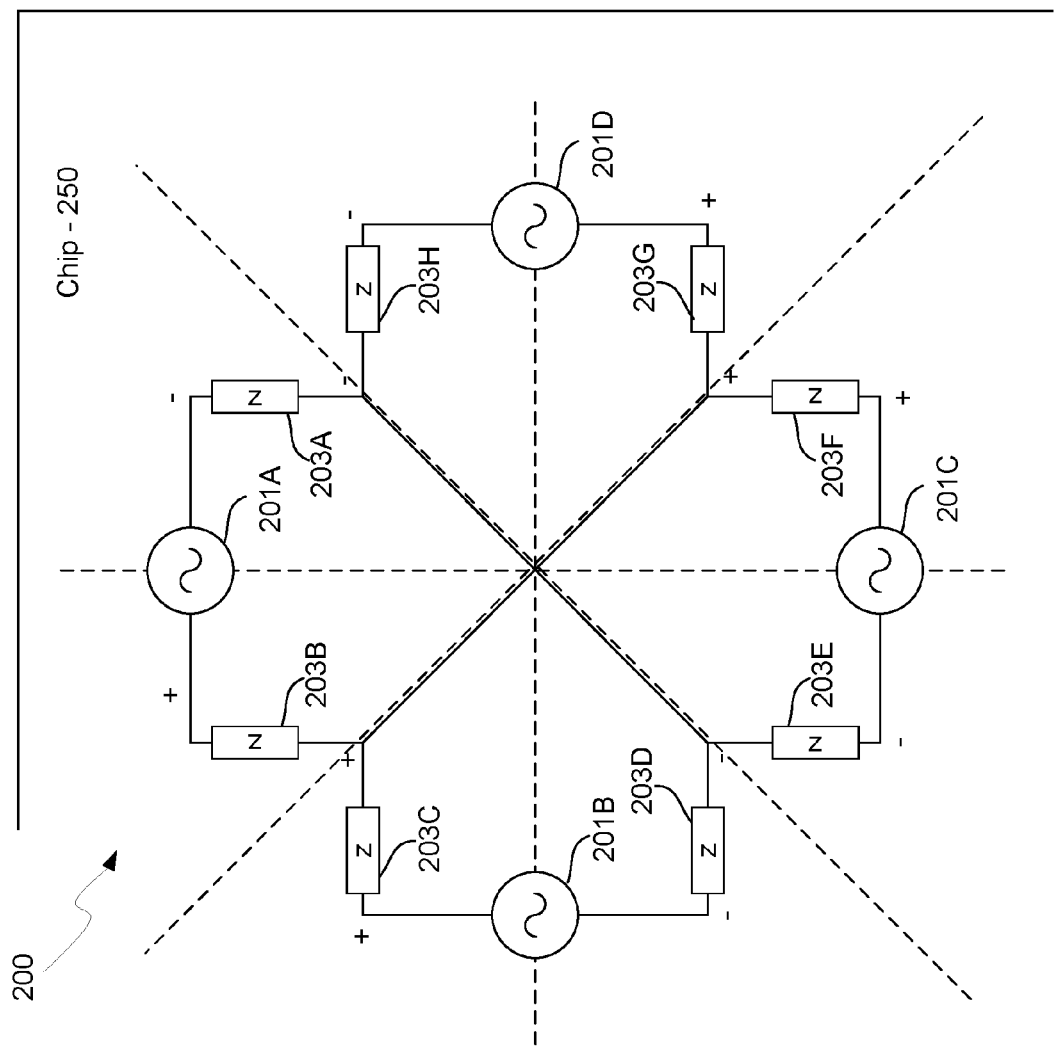
FIG. 2 is a block diagram illustrating an example coupling of a multi-core VCO, which may be used in accordance with various implementations of the disclosure.

FIG. 2 illustrates an example coupling of a multi-core VCO, which may be used in accordance with various implementations of the disclosure. Referring to FIG. 2, there is shown a multi-core VCO 200 on an integrated circuit, or chip 250, the multi-core VCO comprising four VCOs 201A-201D with interconnecting impedances Z 203A-203H, which may comprise resistance, inductance, and/or capacitance in the interconnections between the VCOs. The VCO's 201A-201D may be arranged symmetrically on the chip 250. For example, as shown in FIG. 2, the four VCOs 201A-201D may be arranged equidistant from a center point and with equal spacing between adjacent VCO.

The VCOs 201A-201D each may comprise circuitry that generates an oscillating output signal at a frequency proportional to an input voltage to the VCO. Accordingly, four oscillator signals may be generated by the circuit shown in FIG. 2, although the disclosure is not so limited. Accordingly, any number of VCOs may be interconnected and configured based on power requirements, number of desired output frequencies, and chip space, for example.

The polarities of the VCOs 301A-301D are shown, where the positive and negative terminals of each adjacent pair of VCOs are coupled together, to the same conductive line, or trace, of the interconnection ring 307. The interconnection ring 307 may comprise a circular ring to minimize spacing from points that are not equidistant from a VCO, but other shapes are possible, such as an oval or square, for example.

The high voltage swings often encountered in VCOs may create high electric fields in the region surrounding the VCO, inducing voltage on surrounding signal routings. The configuration of the VCOs in a symmetric fashion as shown in FIG. 2, results in "quiet zones" where there is a lack of these induced voltages. These quiet zones are indicated by the dashed lines, and may indicate where signal lines may be routed with little or no noise from voltages induced by the high voltage swings. Furthermore, a VCO with four (or more) VCOs in parallel may reduce phase noise since it averages phase noise in each device due to the parallel arrangement.

Figure 3:
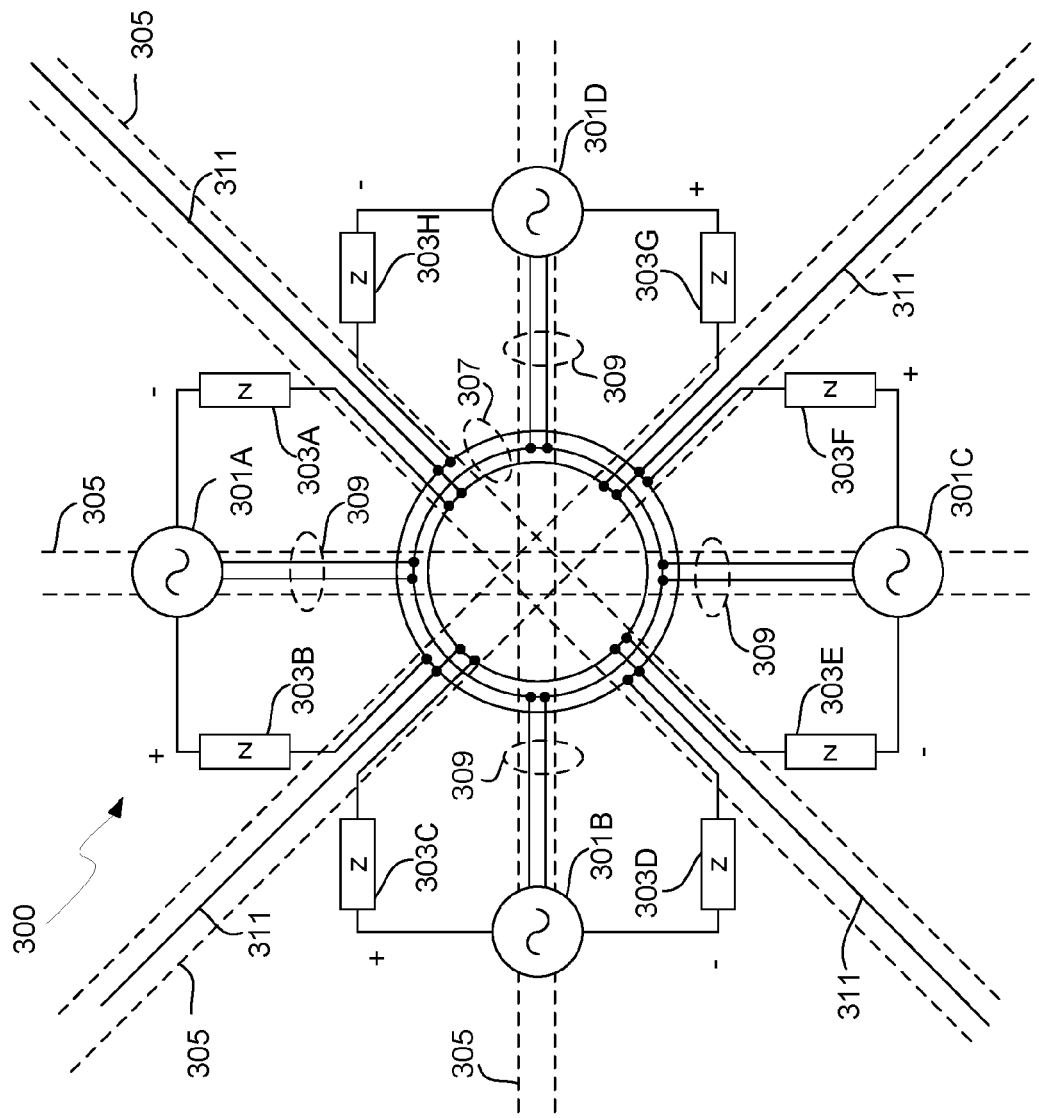
FIG. 3 illustrates another example coupling of a multi-core VCO, which may be used in accordance with various implementations of the disclosure.

FIG. 3 illustrates another example coupling of a multi-core VCO, which may be used in accordance with various implementations of the disclosure. Referring to FIG. 3, there is shown a multi-core VCO comprising four VCOs 301-301D with interconnecting impedances Z 303A-303H, which may comprise resistance, inductance, and/or capacitance in the interconnections between the VCOs 301A-301D.

As shown, there are three interconnecting rings 307 where the signal lines 311 are coupled out of the VCOs 301A-301D via the interconnecting impedances Z 303A-303H, and control and/or bias signals may be communicated to the VCOs 301A-301D via the control lines 309. One the interconnecting rings 307 may be coupled to one of the two terminals of each VCO 301A-301D and another ring coupled to the other of the two terminals of the VCOs 310A-310D. Similarly, although a single ring is shown for clarity, a plurality of rings may be utilized for control signal and bias lines to the VCOs 301A-301D via the control lines 309. Accordingly, while three interconnecting rings 307 are shown, any number of rings may be utilized, depending on the number of interconnections needed.

The VCOs 301A-301D may comprise circuitry that generates an oscillating output signal at a frequency proportional to an input voltage to the VCO 301A-301D. Accordingly, four oscillator signals may be generated by the circuit shown in FIG. 3, although the disclosure is not so limited. Accordingly, any number of VCOs may be interconnected and configured based on power requirements, number of desired output frequencies, and chip space, for example.

As in the example shown in FIG. 2, large voltage swings in the VCOs 301A-301D may induce electric fields in the vicinity of the VCOs, but due to the symmetry of the layout of the multi-core VCO, quiet zones 305, indicated by the dashed lines, may result, where induced fields are minimized/zeroed and thus where input, output, bias, and control signal lines may be routed. In this manner, low-noise signals may be communicated to and from the VCOs 301A-301D via the output lines 311. For example, as shown in FIG. 3, the four VCOs 301A-301D may be arranged equidistant from a center point and with equal spacing between adjacent VCOs.

Accordingly, the conductive interconnects, or traces 309 between the interconnecting rings 307 and the impedances 303A-303G and/or the VCOs 301A-301D may be placed in the quiet zones to minimize induced electric fields in other lines in the circuit. The symmetry of placement of the VCOs 301A-301D results in minimized/zeroed induced fields in regions equidistant from the VCOs.

In an embodiment of the disclosure, a system for a multi-core multi-mode VCO may comprise a plurality of voltage controlled oscillators (VCOs) arranged symmetrically on an integrated circuit, wherein interconnects for said VCOs are arranged in quiet zones at locations equidistant from each pair of said plurality of VCOs. An interconnection ring may be centered within the arranged VCOs that comprises at least two conductive lines that couple to output terminals of each of said plurality of VCOs.

The plurality of VCOs may receive control signals from interconnects coupled to at least one conductive line in the interconnection ring. The plurality of VCOs may receive control signals from a conductive line in said interconnection ring. A positive terminal of a first VCO of a pair of adjacent VCOs of the plurality of VCOs may be coupled to a same conductive line of the interconnection ring as a negative terminal of a second of the pair of adjacent VCOs. The interconnection ring may be circular. Impedances may couple the VCOs to the interconnection ring. Bias signals may be communicated to each of the plurality of VCOs from the interconnection ring. The plurality of VCOs may include four VCOs arranged equidistant from a center point.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a multi-core multi-mode voltage-controlled-oscillator (VCO).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A system, comprising:
a plurality of voltage controlled oscillators (VCOs) arranged symmetrically on an integrated circuit, wherein interconnects for said VCOs are arranged in quiet zones at locations equidistant from each pair of said plurality of VCOs, each of said plurality of VCOs being operable to generate an output signal at a configurable frequency, wherein:
an interconnection ring centered within said arranged VCOs comprises at least two conductive lines that couple to output terminals of each of said plurality of VCOs; and
said plurality of VCOs receive control signals from interconnects coupled to at least one conductive line in said interconnection ring.

2. The system of claim 1, comprising impedances coupling said VCOs to said interconnection ring.

3. The system of claim 1, wherein a positive terminal of a first VCO of a pair of adjacent VCOs of said plurality of VCOs is coupled to a same conductive line of said interconnection ring as a negative terminal of a second of said pair of adjacent VCOs.

4. The system of claim 1, wherein said interconnection ring is circular.

5. The system of claim 1, wherein bias signals are communicated to each of said plurality of VCOs from said interconnection ring.

6. The system of claim 1, wherein said plurality of VCOs comprises four VCOs arranged equidistant from a center point.

7. A method, comprising:
generating a plurality of oscillating signals utilizing a plurality of voltage controlled oscillators (VCOs) arranged symmetrically on an integrated circuit, wherein interconnects for said VCOs are arranged in quiet zones at locations equidistant from each pair of said plurality of VCOs, wherein:
an interconnection ring centered within said arranged VCOs comprises at least two conductive lines that couple to output terminals of each of said plurality of VCOs; and
said plurality of VCOs receive control signals from interconnects coupled to at least one conductive line in said interconnection ring.

8. The method according to claim 7, comprising impedances coupling said VCOs to said interconnection ring.

9. The method according to claim 7, wherein a positive terminal of a first VCO of a pair of adjacent VCOs of said plurality of VCOs is coupled to a same conductive line of said interconnection ring as a negative terminal of a second of said pair of adjacent VCOs.

10. The method according to claim 7, wherein said interconnection ring is circular.

11. The method of claim 7, comprising communicating bias signals to each of said plurality of VCOs from said interconnection ring.

12. The method of claim 7, wherein said plurality of VCOs comprises four VCOs arranged equidistant from a center point.

13. A system, comprising:
a plurality of voltage controlled oscillators (VCOs) arranged symmetrically on an integrated circuit, wherein interconnects for said VCOs are arranged in quiet zones at locations equidistant from each pair of said plurality of VCOs and an interconnection ring coupled to said interconnects, each of said plurality of VCOs being operable to generate an output signal at a configurable frequency, wherein said plurality of VCOs receive control signals from interconnects coupled to at least one conductive line in said interconnection ring.

14. The system of claim 13, comprising impedances coupling said VCOs to said interconnection ring.

15. The system of claim 13, wherein a positive terminal of a first VCO of a pair of adjacent VCOs of said plurality of VCOs is coupled to a same conductive line of said interconnection ring as a negative terminal of a second of said pair of adjacent VCOs.

16. A system, comprising:
a plurality of voltage controlled oscillators (VCOs) arranged symmetrically on an integrated circuit, wherein interconnects for said VCOs are arranged in quiet zones at locations equidistant from each pair of said plurality of VCOs, each of said plurality of VCOs being operable to generate an output signal at a configurable frequency, wherein:
an interconnection ring centered within said arranged VCOs comprises at least two conductive lines that couple to output terminals of each of said plurality of VCOs; and
a positive terminal of a first VCO of a pair of adjacent VCOs of said plurality of VCOs is coupled to a same conductive line of said interconnection ring as a negative terminal of a second of said pair of adjacent VCOs.

17. The system of claim 16, comprising impedances coupling said VCOs to said interconnection ring.

18. The system of claim 16, wherein said interconnection ring is circular.

19. The system of claim 16, wherein bias signals are communicated to each of said plurality of VCOs from said interconnection ring.

20. The system of claim 16, wherein said plurality of VCOs comprises four VCOs arranged equidistant from a center point.

21. A method, comprising:
generating a plurality of oscillating signals utilizing a plurality of voltage controlled oscillators (VCOs) arranged symmetrically on an integrated circuit, wherein interconnects for said VCOs are arranged in quiet zones at locations equidistant from each pair of said plurality of VCOs, wherein:
an interconnection ring centered within said arranged VCOs comprises at least two conductive lines that couple to output terminals of each of said plurality of VCOs; and
a positive terminal of a first VCO of a pair of adjacent VCOs of said plurality of VCOs is coupled to a same conductive line of said interconnection ring as a negative terminal of a second of said pair of adjacent VCOs.

22. The method according to claim 21, comprising impedances coupling said VCOs to said interconnection ring.

23. The method according to claim 21, wherein said interconnection ring is circular.

24. The method of claim 21, comprising communicating bias signals to each of said plurality of VCOs from said interconnection ring.

25. The method of claim 21, wherein said plurality of VCOs comprises four VCOs arranged equidistant from a center point.

26. A system, comprising:
a plurality of voltage controlled oscillators (VCOs) arranged symmetrically on an integrated circuit, wherein interconnects for said VCOs are arranged in quiet zones at locations equidistant from each pair of said plurality of VCOs and an interconnection ring coupled to said interconnects, each of said plurality of VCOs being operable to generate an output signal at a configurable frequency, wherein a positive terminal of a first VCO of a pair of adjacent VCOs of said plurality of VCOs is coupled to a same conductive line of said interconnection ring as a negative terminal of a second of said pair of adjacent VCOs.

27. The system of claim 26, comprising impedances coupling said VCOs to said interconnection ring.

* * * * *